United States Patent [19]

Harigaya

[11] Patent Number: 4,499,587
[45] Date of Patent: Feb. 12, 1985

[54] COUNTING DEVICE FOR INFORMATION RECORDING-REPRODUCING DEVICE

[75] Inventor: Isao Harigaya, Kanagawa, Japan

[73] Assignee: Canon Kabushiki Kaisha, Tokyo, Japan

[21] Appl. No.: 304,623

[22] Filed: Sep. 22, 1981

[30] Foreign Application Priority Data

Sep. 24, 1980 [JP] Japan ............................. 55-133195
Sep. 24, 1980 [JP] Japan ............................. 55-133207

[51] Int. Cl.$^3$ ............................................. G06M 3/08
[52] U.S. Cl. .................................... 377/18; 360/72.1; 377/112
[58] Field of Search ........................................... 377/18

[56] References Cited

U.S. PATENT DOCUMENTS 4,366,371 12/1982 d'Alayer de Costemore d'Arc ................................... 377/18
4,385,228 5/1983 Kanayama et al. ................... 377/18
4,398,279 8/1983 Titus et al. .......................... 360/137

Primary Examiner—Joseph A. Orsino, Jr.
Assistant Examiner—Timothy K. Greer
Attorney, Agent, or Firm—Toren, McGeady and Stanger

[57] ABSTRACT

A recording-reproducing device of information such as pictures, voices and so on, in which the used amount of the recording medium is counted. A plural number of the memory devices for memorizing the counted value of the used amount when the recording medium which has not been used is exchanged.

2 Claims, 2 Drawing Figures

COUNTING DEVICE FOR INFORMATION RECORDING-REPRODUCING DEVICE

BACKGROUND OF THE INVENTION

1. Field of the Invention

The present invention relates to a device for counting the used amount of the recording medium to be loaded in the device for recording or reproducing the informations such as pictures, voices and so on.

2. Description of the Prior Art

Until now, the recording or record reproducing device is in most cases provided with only one counting device for counting and memorizing the used amount of the recording medium, such as film or magnetic tape for 8 mm motion picture camera, video camera and so on. Such counting device is automatically reset when the recording medium is taken out of the recording device. For example, when, in the case of the 8 mm motion picture camera, a silent film is intended to be changed for a sound film for a daylight type film, the photographer has to memorize the used amount of the film to be taken out at the time of the film exchange. Further, when the once taken out film is to be re-loaded, if the content of the film counter is reset, the photographer has to carry out the photographing, observing the counter by deducting the amount of the film from the total length of the photographable film, which is very inconvenient. This applies not only in the case of the motion picture camera but also in the case of the video camera, in which the magnetic tape is used.

SUMMARY OF THE INVENTION

It is a first object of the present invention to provide a counting device free from the above-mentioned inconvenience of the conventional recording or record reproducing device, and, more particularly, a recording or a record reproducing device capable of exchanging the recording medium which has not been used completely, in which the used amount is memorized with the built-in semiconductor memory at the time of the recording medium exchange. Also, a plural number of the recording media can be selected with the change-over switch in such a manner that the counting is started from the used amount when the recording medium is reloaded because the counter memorizes the used amount. Namely, in the case of the device of the present invention, it is sufficient for the photographer to operate the selection switch in accordance with the recording medium to be used, which is extremely convenient.

DESCRIPTION OF PREFERRED EMBODIMENTS

Figure 1:
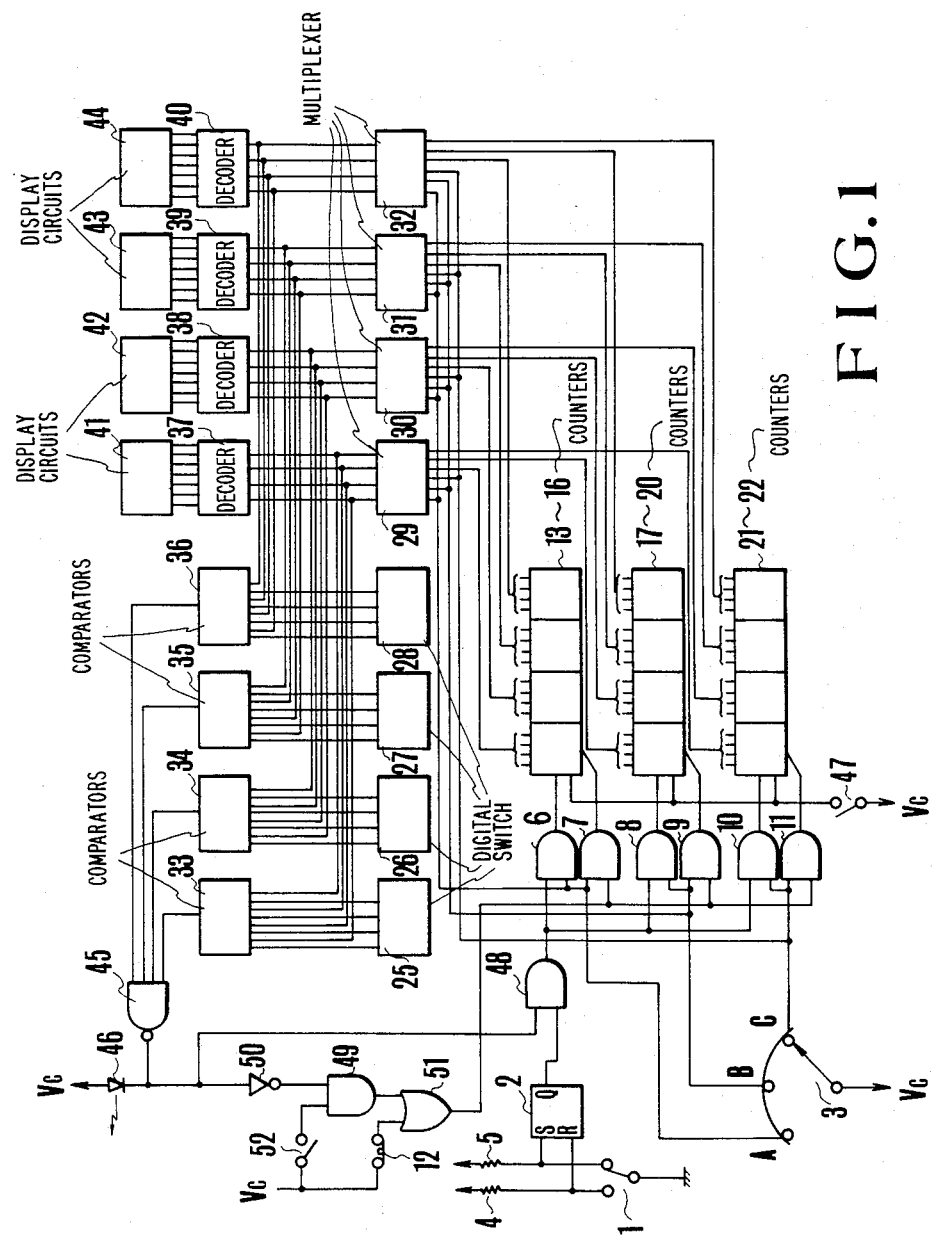
FIG. 1 shows an embodiment of the circuit diagram of the counting device of the present invention for the record reproducing device.

In FIG. 1, element 1 is the switch for the input signal produced in synchronization with the running of the medium, whereby a L level signal is obtained with the resistors 4 and 5 when the switch 1 is closed, while a H level signal is obtained when the switch 1 is opened. Element 2 is the Flip-Flop circuit for absorbing the chattering of the switch 1. Element 3 is the rotary switch to be changed over in accordance with the recording medium to be used. In the case of the embodiment shown in the drawing, the rotary switch can be changed over in accordance with three kinds of media A, B and C. Elements 6 to 11 constitute an AND gate, whose input is changed over in accordance with the state of the above-mentioned switch 3 and other switches. Element 12 is the reset switch for clearing the content of the counter, being manually operated from outside. Elements 13 to 16, 17 to 20 and 21 to 24 are respectively the counters for the synchronized input signal. In the drawing, there are three counters for three inputs A, B and C, in which counters the used amount of respective media is memorized. Elements 25 to 28 constitute a digital switch for setting the total length of the recording media to be used. Elements 29 to 32 constitute a multiplexer for selecting the contents of the counters 13 to 16, 17 to 20 and 21 to 24 in accordance with the change over of the above-mentioned rotary switch 3. Elements 33 to 36 constitute a comparator circuit for comparing the content set with the above-mentioned digital switch 25 to 28 with that of the counter selected with the multiplexer. Elements 37 to 40 constitute the decoder circuit for decoding the content of the counter, while elements 41 to 44 constitute the display circuit. Element 45 is the NAND gate to be supplied input with the coincidence signal from the above-mentioned comparator circuit 33–36. Element 46 is a light emitting diode (LED) to be lit with the output of the NAND gate 45 so as to display the count over of the recording medium. Element 47 is the switch for count down the count content when the recording medium is wound back. Element 48 is the AND gate for stopping the counting in the case of the count over. Element 49 is the AND gate for producing the logic product of the count over signal inverted by the inverter 50 with the signal from the switch 52, which produces a signal when the recording medium is taken out of the device. Element 51 is the OR gate for producing the logic product of the output of the AND gate 49 with the signal of the reset switch 12, so as to reset the counter.

Below, the operation of the circuit shown in the drawing will be explained. When now the recording medium is loaded in the recording device and permitted to run, a signal is produced in synchronization of its running. This is shown with by the switch 1 in the drawing. The signals produced at its terminals are input to the set terminal S and the reset terminal R of the Flip-Flop circuit. One pulse is produced at the Q output of the Flip-Flop in accordance with one of the input signals so as to avoid the misoperation due to the chattering of the switch. The rotary switch 3 changes over the circuits in accordance with the kind of a plural number of the recording media. Below, the case when the rotary switch 3 is connected to the point A will be explained. When the point A assumes the H level, the AND gate 6 becomes conductive, whereby the counter 13–16 assumes the countable state. When the rotary switch 3 is connected to the point B, the counter 17–20 starts to operate through the AND gate 8. When the switch 3 is connected to the point C, the counter 21–24 starts to operate through the AND gate 10. Every counter is a 4 position binary-decimal reversible one, whereby the counting direction of the counter is changed over with the closing and the opening of the switch 47. Further, the counter is reset with the closing of the single reset switch 12 through the OR gate 51 and the AND gate 7, 9 or 11. Namely, when the switch 3 is set at A, the H level of the reset switch 12, which is depressed, is input to the AND gate 7 through the OR gate 51, which gate produces the H level together with the H level from A of the switch 3, so as to clear the counter 13-16. At this time, neither the counter 17-20 nor the counter 21-24 is not cleared, because the AND gate 9 as well as AND gate 11 are not conductive. Further, when the recording medium loaded in the recording device has been used and taken out from the recording device, the switch 52 is closed. At this time, the level of the two inputs of the AND gate 49 becomes H, whereby the H level outputs are supplied to the reset terminal of the counter through the OR gate 51, so as to clear the counter in the same way as in the above case. The counting along the forward direction of the counter is carried out with the closing of the switch 47; the counter counts in the reversed direction when the switch 47 is opened. All of the contents of the counters 13-16, 17-20 and 21-24 are input in the multiplexer 29-32, in which the signal produced with the change over of the rotary switch 3 is supplied, so as to select the information. Hereby, the multiplexer 29 works for the first position of the counter, the multiplexer 30 for the second position, the multiplexer 31 for the third position and the multiplexer 32 for the fourth position. The information selected with the multiplexer through the contact selection with the rotary switch 3 is decoded with the 7 segment display decoder 37-40 and delivered to the display circuit 41-44, so that the display device displays the content of the counter. The content of the counter selected with the multiplexers 29-32 is input to the comparator circuit 33-36 to be compared with the content of the digital switch 25-28 in which the total length of the above-mentioned recording medium to be used. When the two inputs coincide with each other, the level of all the outputs of the comparison circuit becomes H, while the NAND gate produces the L level signal, by means of which the LED 46 lights so as to indicate to the user that the whole amount of the recording amount has been used. The L level signal for finishing the whole amount is supplied to the AND gate 48 so as to stop the counter. Further, the L level signal inverted by the inverter 50 is supplied to the AND gate 49 to be treated with the H level signal produced with the closing of the switch 52 when the recording medium is taken out of the device in such a manner that the level of the output of the AND gate 49 is inverted from L into H. This H level signal resets the counter set with the above-mentioned rotary switch 3 through the OR gate 51.

In case the recording medium has been used partially and taken out of the device, the output of the AND gate 49 is not inverted even when the switch 52 is closed with the taking out of the recording medium because the level of the output of the inverter 50 is L. Thus, the counter is not reset. Consequently, the counter holds the content when the recording medium was taken out.

As explained above, even if the recording medium is changed for another one, the amount used until then is memorized in the counter in such a manner that when the first recording medium is re-loaded the counting is started from the amount already used. Thus, even if a recording medium is once taken out of the device in accordance with necessity and re-loaded in the device, the user can learn the exact amount used. Hereby, the recording media whose number corresponds to that of the change over switch 3 can be used.

Figure 2:
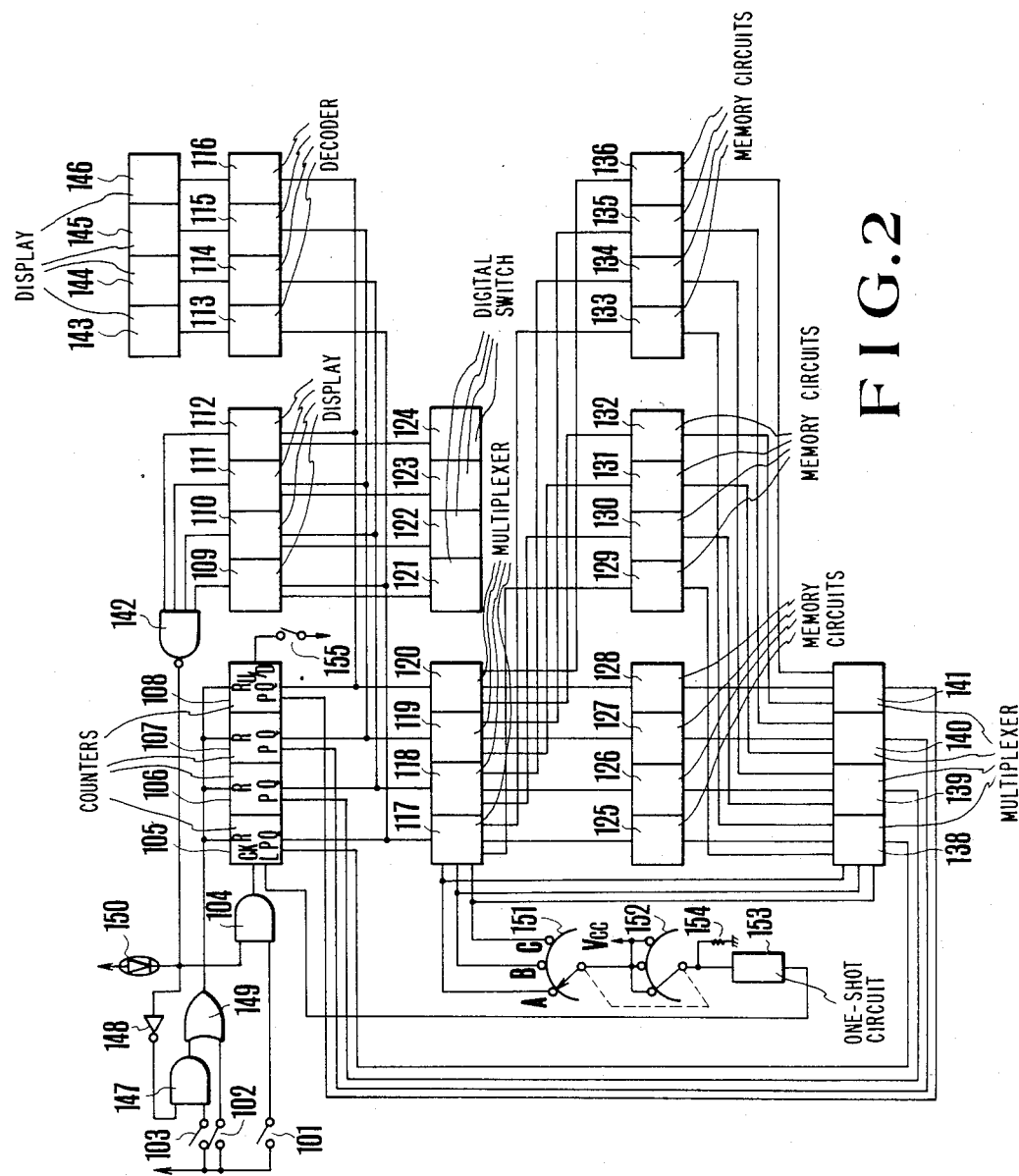
FIG. 2 shows another embodiment of the circuit diagram.

Below, another embodiment shown in FIG. 2 will be explained. In the drawing, element 101 is a switch to be closed in synchronization with the running of the recording medium for producing a signal to be supplied to the AND gate 104. Element 102 is the reset switch for resetting the counter for counting the running amount of the recording medium. Element 103 is the switch to be closed so as to produce a signal when the recording medium is taken out of the device. Elements 105-108 constitute a counter for counting the signals from the switch 101, being a reversible counter capable of counting along the forward and the backward direction in accordance with the closing and opening of the switch 155. Elements 109-112 constitute a comparator circuit for comparing the content of the counter and the set content of the used amount of the recording medium so as to produce a coincidence output. Elements 113-116 constitute a decoder to decode the content of the counter 109-112, and 143-146 constitute a display device. Element 151 is a rotary switch in operative engagement with the change over switch of the recording medium. Elements 117-120 and 138-141 respectively connected to the outputs P and the inputs Q of the counter 105-108 constitute a multiplexer for selecting memory in accordance with the selection of the change over switch 151, and elements 121-124 constitute the digital switch for setting the total length of the used recording medium. Elements 125-128, 129-132 and 133-136 respectively constitute memory circuits for the channels A, B and C of the change over switch 151. Element 142 is the NAND gate to which the coincidence signal of all the positions of the comparator circuit 109-112, 150 is the LED for displaying that the total amount of the recording medium has been used. Element 147 is an AND gate, element 148 is an inverter and element 149 is an OR gate, whereby they control the resetting of the counter. Element 153 connected to the change over switch 152 is the one shot circuit for producing a H level output for a certain determined time by means of the channel change over signal and element 154 is the resistor for setting the input level of the one shot circuit 153.

Below, the operation of the circuit shown in the drawing will be explained. The signal produced by 101 in synchronization with the running of the recording medium is supplied to the AND gate 104, to which another signal is supplied from the NAND gate 142. When the gate 142 does not produce the coincidence signal, it produces a H level signal, whereby the AND gate 104 is conductive so as to deliver the signal from the switch 101 to the counter 105-108. The counter is an up-down counter of binary-decimal system, whereby the counter 105 works for the first position, while the counter 108 works for the fourth position. The content of the counter 105-108 is always delivered from the Q terminal to the comparison circuit 109-112, the display decoder and the multiplexer 117-120. The multiplexer 117-120 is changed over with the channel select switch 151, whereby its output is supplied to one of the memory 125-128, 129-132 and 133-136 so as to be memorized in the counter. Further, the content of the counter 105-108 is decoded with the display decoder 113-116 into the 7 segment display signal so as to be displayed with the display device 143-146 in a digital way. To the comparison circuit 109-112, the content of the above-mentioned counter and that of the digital switch 121-124 at which the total length of the recording medium is set are supplied in such a manner that both contents coincide with each other and the level of the output of the NAND gate 142 is inversed out of H into L level. At the same time, when the LED 150 is lit with the coincidence signal so as to display that the total length has been used, the AND gate 104 is closed and the signal from the switch 101 stops the counting. When the recording medium is taken out of the device in this state, the switch 103 is closed so as to supply the H level signal to the AND gate 147, which delivers the H level signal to the R terminal of the counter 105 through the OR gate 149 so as to clear the content of the counter. Further, it is possible to clear the counter with the closing of the reset switch 102.

Along with the operation of the channel change over switch 151, the rotary switch 152 in operative engagement herewith is also changed over, whereby a signal whose level changes from H→L→H is produced on the resistor connected to the switch 152. This signal is supplied to the one shot circuit 153, which is triggered with the rising up of the input pulse so as to produce certain determined pulses without changing over the channel. While the pulses are being produced, the content of the memories 125–128, 129–152 and 133–136 is selected with the multiplexer 138–141 in accordance with the channel selector 151 so as to be loaded in the counter 105–108.

As explained above in detail in accordance with the embodiment, in the case of the counting device of the present invention, even when the recording medium which has not been used completely is taken out of the device or re-loaded in the device, the count can be carried out from the used amount of the recording medium at the time of the change over. Further, it is possible to take out or re-load a plural number of the recording media, whereby the user can learn the exact amount used.

What is claimed is:

1. A counting device for counting the used amount of the recording medium capable of recording and reproducing information such as pictures, voices and so on and of being loaded into or taken out of the information recording or the record reproducing device, comprising:

signal producing means for producing signals in accordance with the running of the recording medium;

a counter for counting the signals;

display means for displaying the content of the counter;

plural number of memory means for memorizing the content of the counter;

selection means for selecting a memory means to be connected to the counter, whereby display means is changed over from displaying the content of said counter to display the content of a selected memory means when said memory means is connected to said counter;

set means for setting the total usable length of the recording medium;

comparator means for comparing the content of the set means with that of the counter so as to produce a coincidence signal;

means for producing a signal when the recording medium is taken out of the recording device;

means to be operated alone so as to produce a reset signal of the counter; and gating means for carrying out the reset operation of the counter either with the logic product of the coincidence signal from the comparator means with the signal produced when the recording medium is taken out of the recording device or with the reset signal.

2. A counting device for counting the used amount of the recording medium capable of recording and reproducing information such as pictures, voices and so on and of being loaded into or taken out of the information recording or the record reproducing device, comprising:

signal producing means for producing signals in accordance with the running of the recording medium;

a plural number of counters for counting the signals;

display means for displaying the content of a selected counter;

selection means for selecting one of said counters such that each counter is rendered operable only when selected by said selection means, and said counters storing their respective contents when rendered inoperable by said selection means;

set means for setting the total usable amount of the recording medium;

comparator means for comparing the content of the set means with the content of the selected counter so as to produce a coincidence signal;

means for producing a signal when the recording medium is taken out of the recording device;

means to be operated alone so as to produce a reset signal of the counter; and gating means for carrying out the reset operation of the counter either with the logic product of the coincidence signal from the comparator means with the signal produced when the recording medium is taken out of the recording device or with the reset signal.

* * * * *